United States Patent
Miller et al.

(10) Patent No.: US 6,753,037 B2
(45) Date of Patent: Jun. 22, 2004

(54) RE-COATING MEMS DEVICES USING DISSOLVED RESINS

(75) Inventors: Seth Miller, Sachse, TX (US); Vincent C. Lopes, Lucas, TX (US); Michael F. Brenner, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 151 days.

(21) Appl. No.: 09/886,781

(22) Filed: Jun. 21, 2001

(65) Prior Publication Data

US 2002/0012744 A1 Jan. 31, 2002

Related U.S. Application Data

(60) Provisional application No. 60/213,043, filed on Jun. 21, 2000, and provisional application No. 60/259,101, filed on Dec. 31, 2000.

(51) Int. Cl.[7] ................................................. B05D 3/12

(52) U.S. Cl. .................... 427/240; 427/379; 427/385.5; 427/388.1; 427/407.1; 427/409; 427/425

(58) Field of Search ................................ 427/240, 425, 427/385.5, 407.1, 409, 388.1, 379; 118/52, 320

(56) References Cited

U.S. PATENT DOCUMENTS

| | | | |
|---|---|---|---|
| 5,061,049 A | | 10/1991 | Hornbeck |
| 5,512,374 A | * | 4/1996 | Wallace et al. ............. 428/422 |
| 5,583,688 A | | 12/1996 | Hornbeck |
| 6,020,215 A | * | 2/2000 | Yagi et al. .................... 438/52 |
| 6,248,668 B1 | * | 6/2001 | Beebe et al. ................. 438/702 |
| 6,391,523 B1 | * | 5/2002 | Hurditch et al. .......... 430/280.1 |
| 6,391,800 B1 | * | 5/2002 | Redd et al. .................. 438/782 |

* cited by examiner

*Primary Examiner*—Shrive P. Beck
*Assistant Examiner*—Kirsten Crockford Jolley
(74) *Attorney, Agent, or Firm*—Charles A. Brill; Wade James Brady, III; Frederick J. Telecky, Jr.

(57) ABSTRACT

A method for coating free-standing micromechanical devices using spin-coating. A solution with high solids loading but low viscosity can penetrate the free areas of a micromachined structure. Spinning this solution off the wafer or die results in film formation over the devices without the expected damage from capillary action. If an organic polymer is used as the solid component, the structures may be re-released by a traditional ash process. This method may be used as a process in the manufacture of micromechanical devices to protect released and tested structures, and to overcome stiction-related deformation of micromechanical devices associated with wet release processes.

42 Claims, 3 Drawing Sheets

RE-COATING MEMS DEVICES USING DISSOLVED RESINS

CROSS-REFERENCE TO RELATED APPLICATIONS

This application claims priority under 35 USC § 119(e)(1) of application No. 60/213,043 filed Jun. 21, 2000 and application No. 60/259,101 filed Dec. 31, 2000.

The following patents and/or commonly assigned patent applications are hereby incorporated herein by reference:

| Patent No. | Filing Date | Issue Date | Title |
| --- | --- | --- | --- |
| 5,061,049 | Sep. 13, 1990 | Oct. 29, 1991 | Spatial Light Modulator and Method |
| 5,583,688 | Dec. 21, 1993 | Dec. 10, 1996 | Multi-Level Digital Micromirror Device |

FIELD OF THE INVENTION

This invention relates to the field of micro electromechanical systems (MEMS), more particularly to methods used to coat the devices, more particularly to methods used to coat the devices with dissolved resins without structural damage.

BACKGROUND OF THE INVENTION

Micro-electro-mechanical systems (MEMS) or micromechanical devices are micron-scale devices, often with moving parts, and are fabricated using traditional semiconductor processes such as optical lithography, doping, metal sputtering, oxide deposition, and plasma etching which have been developed for the fabrication of integrated circuits.

Micromirrors, such as the DMD™ micromirror array from Texas Instruments, are a type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

MEMS devices are extremely robust on their own scale, but are easily destroyed by macroscopic forces such as capillary attraction. A MEMS device caught in the surface tension of a liquid will move with that liquid, bending or even breaking in the process. A droplet of water or organic solvent on a MEMS device will pull the device down as it evaporates. Even if the device is not irreversibly deformed, it is likely to be trapped in a bent state by surrounding devices.

The fragile nature of the MEMS devices can make them difficult to manufacture in a cost effective manner. In the case of micromirror arrays, once the sacrificial layers beneath the micromirror have been removed, the mirrors are very fragile and very susceptible to damage due to particles. The particles become trapped in the mechanical structure of the micromirror array and can prevent the micromirror from operating. Because the particles cannot be washed out of the array without destroying the array, it is necessary to separate the wafers on which the devices are formed, and wash the debris off the devices, prior to removing the sacrificial layers under the mirrors—also called undercutting the mirrors. Furthermore, because the chip bond-out process also creates particles, it is desirable to mount the device in a package substrate and perform the chip bond-out process prior to undercutting the mirrors.

Unfortunately, it is only after the mirrors have been undercut that the micromirror array is able to be tested. Following a standard micromirror production flow, all of the devices manufactured are be mounted on package substrates, bonded-out to the substrates, and undercut prior to testing the devices. Additionally, micromirrors typically require some sort of lubrication to prevent the micromirror from sticking to the landing surfaces when it is deflected. Therefore, the devices must also be lubricated and the package lid or window applied prior to testing the devices. Because a typical micromirror package is very expensive, the packaging costs associated with devices that do not function greatly increase the cost of production and must be recovered by the devices that do function.

What is needed is a method of testing the micromechanical structure of a micromirror array prior to packaging the micromirror array. This method would enable a production flow that would only package the known good devices. Thus, the significant cost associated with the packaging the failed die would be eliminated.

SUMMARY OF THE INVENTION

Objects and advantages will be obvious, and will in part appear hereinafter and will be accomplished by the present invention which provides a method and system for recoating MEMS devices using dissolved resins. One embodiment of the invention provides a method of coating free-standing micromechanical devices. The method comprising: depositing an organic resin coating material on a micromechanical device, the coating material comprised of at least 35% solids in a solvent, said coating material having a viscosity no greater than 120 centistokes; and curing the coating material.

Another embodiment of the invention provides a method of coating free-standing micromechanical devices. The method comprising: depositing an organic resin coating material on a micromechanical device, the coating material comprised of at least 35% solids in a solvent, the coating material having a viscosity no greater than 120 centistokes; rotating the micromechanical device to distribute the organic coating material; and curing the coating material.

Another embodiment of the invention provides a method of coating free-standing micromechanical devices. The method comprising: depositing an organic resin coating material on a micromechanical device, the coating material comprised of at least 35% solids in a solvent, the coating material having a viscosity no greater than 120 centistokes; and curing the coating material.

Another embodiment of the invention provides a method of coating free-standing micromechanical devices. The method comprising: depositing a solvent layer on a micromechanical device; depositing an organic resin coating material on solvent layer; allowing the organic resin coating material to displace the solvent layer; and curing the coating material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new process has been developed that allows a fully fabricated and tested MEMS device to be covered with a protective resin. The protected MEMS device is durable enough to withstand device separation and cleanup steps, as well as shipping stresses, thus allowing the devices to be completed and tested in wafer form, then coated with the protective layer, shipped, and diced for packaging. After mounting the functional devices in a package substrate, the protective covering is removed and the package sealed.

Figure 1:
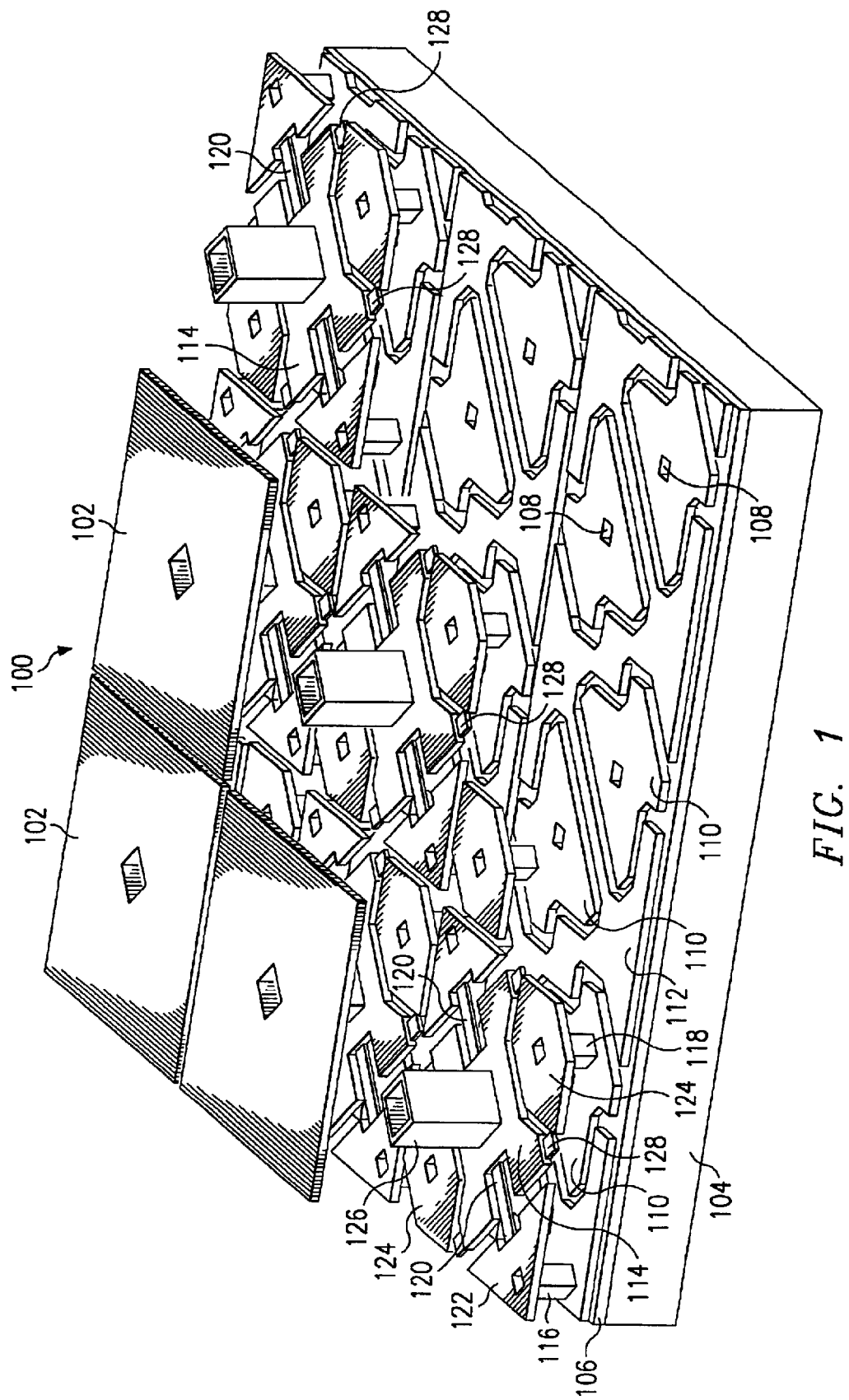
FIG. 1 is a perspective view of a small portion of a micromirror array of the prior art.
Figure 2:
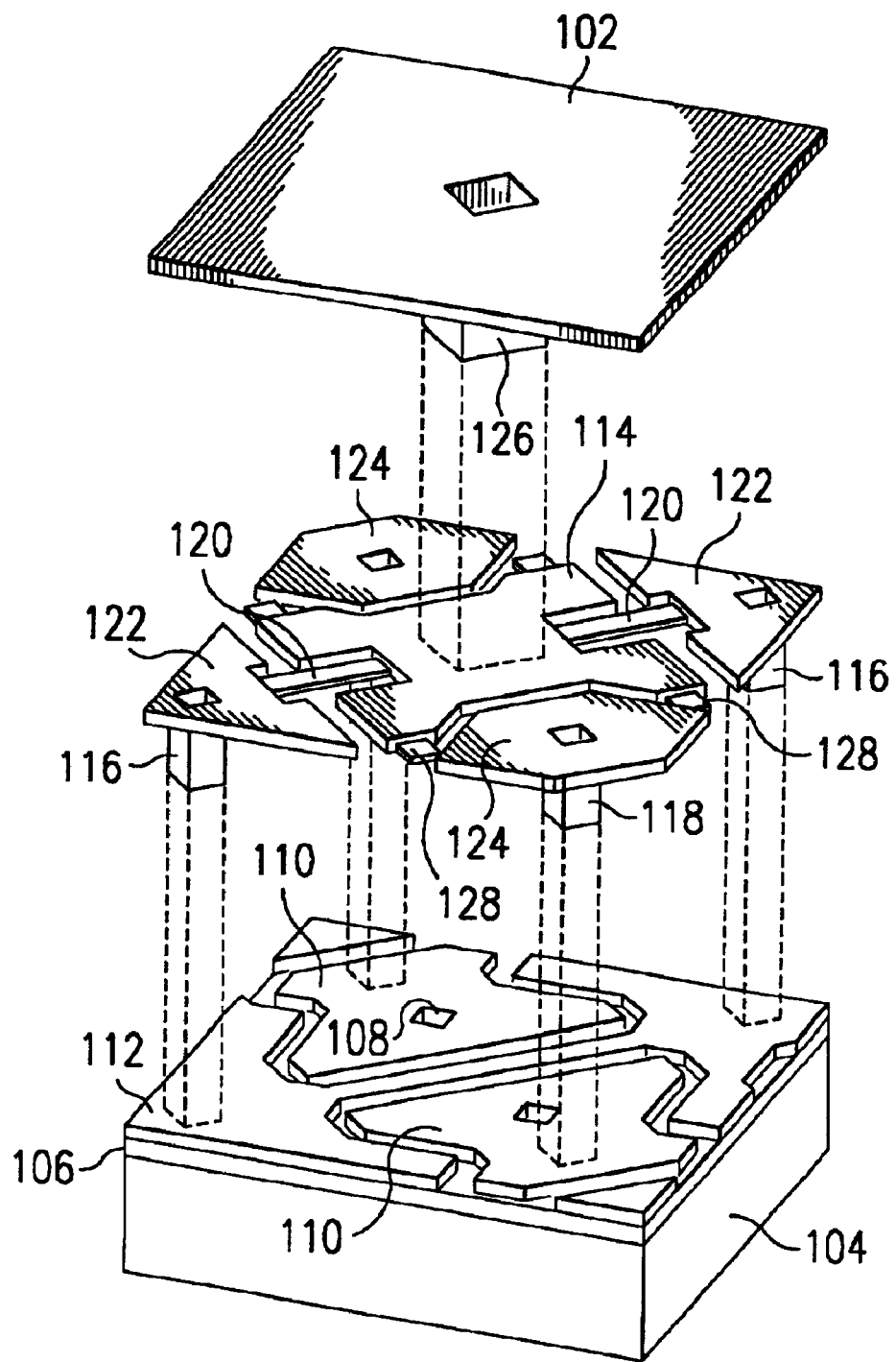
FIG. 2 is an exploded perspective view of a single micromirror element from the micromirror array of FIG. 1.

For the purpose of illustration, but not for the purpose of limitation, the following description will describe the recoating of a micromirror array. FIG. 1 is a perspective view of a portion of a micromirror array 100. In FIG. 1, some of the mirrors have been removed to illustrate the underlying structure of the device. FIG. 2 is an exploded view of a single micromirror element. Micromirrors are especially challenging to recoat without damage due to the relatively large thin mirror 102. The mirror is roughly 13 to 17 $\mu$m on each side, and only about 200 nm thick. Each array contains between 500,000 and 1.3 million micromirrors, each separated by a gap slightly less than 1 $\mu$m.

The micromirrors are supported approximately 3.3 microns above the substrate 104, by a mirror support spacervia 126 attached to a hinge yoke 114 supported by a torsion hinge 120 less than 100 nm thick. The mirror and associated structures are aluminum and aluminum alloys. The hinges are attached to a hinge cap 122 supported by hinge spacervias 116. The hinge spacervias are formed on a mirror bias metal layer 112 over an insulating oxide layer 106. Other structures include the address electrodes 110, upper address electrodes 124, electrode support spacervias 118. The address electrodes are connected to circuitry on the underlying semiconductor substrate through vias 108 through the oxide layer. The micromirror is designed to twist about the torsion hinge axis until stopped by contact between springtips 128 and the mirror bias metalization layer 112 when an attractive electrostatic force is created between an address electrode and the hinge yoke, and between the upper address electrode and the mirror.

Because of the very small dimensions of the micromirror and other MEMS structures, very small forces are sufficient to destroy the devices. Conventional wisdom has been that the structures are too weak to withstand contact with any solid or liquid, or strong flow of gas once the mirrors have been undercut. This view was reinforced through experiments in which application of various liquids, including photoresist and water, destroyed the mirrors on a micromirror. The fluids were assumed to have torn the mirrors away from the underlying structure due to the mass of the fluids and the centrifugal force created by spinning the wafer during the application and spreading of the liquid.

Previously, the only way to apply a solution to a MEMS device and remove that solution without damage resorted to esoteric solvents, such as supercritical carbon dioxide. MEMS devices that used wet release processes could chase way the original solvent by gradually replacing it with a liquid such as cyclohexane, freezing the liquid, and subliming the frozen liquid away. This method can be effective, but suffers from slow cycle time and non-traditional handling techniques. Overcoming these limitations would not only allow structures to be released without regard to stiction, but also would allow solution phase chemistry, such as electrodeless deposition, to be applied to an entire MEMS device after release. Such a technique might be used to deposit an anti-stiction coating, for example, but is difficult given current technology.

Recoating of MEMS devices after release is also prohibited by problems associated with capillary attraction. A recoat technique would allow devices to be tested and inspected after release, then re-encapsulated and shipped or subjected to further processing. A recoated device could even be further patterned and processed. One technique for recoating has been to use PARYLENE™, which can be deposited from the gas phase and thus does not incur capillary action. This technique is slow, expensive, cannot be directly patterned, and relies on specialized equipment not found in most semiconductor fabrication facilities.

What follows is a simple, universal method of overcoming problems associated with device deformation by capillary forces. This method is fast, uses standard semiconductor equipment, and can be adapted to a manufacturing environment. It can be applied both to general release problems, and more specifically to intentionally coating a free-standing MEMS device with a solid film. A free-standing MEMS is considered to be any micromechanical device with sufficient sacrificial materials removed to leave parts supported or extending above a device substrate.

The present invention is based on the novel insight that the damage to the device not only occurs during the application and smoothing of the protective layer, but also from the capillary forces created by the surface tension of the coating solvents as the solvents evaporate from the coating. With a proper understanding of the damage mechanisms, coatings are applied without damage to very sensitive micromechanical devices.

Previous recoating attempts using spin-coating methods have failed because the properties of the coating solution must be specifically tuned for the geometry of the device. In particular:

1. The solid loading of the solution should be as high as possible.
2. The viscosity of the solution must be as low as possible.
3. The surface tension of the solution should be minimized and the device surface wetting maximized.
4. The solution should rapidly dissolve trapped gasses, and not allow gasses to bubble out either during the coating process or on baking.
5. The coating should be uniform.
6. The solid should ash cleanly, leaving little to no residue on the substrate.

It is impossible to optimize all these variables simultaneously, and compromises can be allowed based on the specifics of the device.

Figure 3:
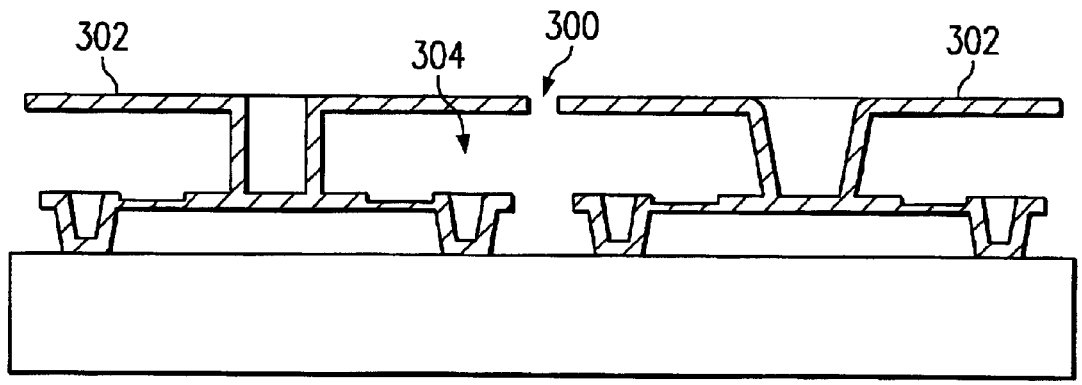
FIG. 3 is a cross-section side view of a micromirror device.

Devices are damaged through several mechanical mechanisms. First, if an extremely viscous coating is applied to the device, the coating may not be able to enter very small crevices in the device. In the case of micromirror arrays, shown in FIG. 3, the coating material may not be able to seep through the gaps 300 between the mirrors 302 in a time that is practical for production process flows. If the coating hardens without entering the region 304 beneath the mirrors, an air pocket is formed. While the coating above the mirrors may protect the mirrors from debris generated during wafer separation, the air pocket can damage the device when the air trapped in the region 304 is heated and expands. Thus, a low viscosity coating fluid helps to avoid damage to the micromechanical structures.

Figure 4:
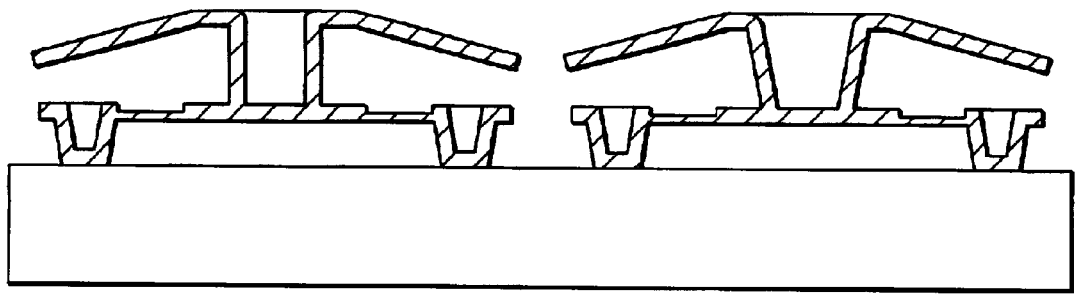
FIG. 4 is a cross-section side view of a micromirror device showing damage to the structure due to an improper recoat.

The capillary forces created by the coating fluid also have the potential to damage the MEMS device. The solvent contained in the coating fluid primarily is responsible for the damage that occurs when the coating is curing. This is because solvents, the primary component of most of the coating fluids of interest, typically have higher a surface tension than the dissolved filler material. For example, common AZ-P3D-SF photoresist contains approximately 85% propylene glycol monomethyl ether (PGMEA) as a solvent. As this solvent evaporates, the capillary forces pull on the minor and the underlying mechanical structures and can easily bend or break the structures. This damage mechanism, which accounts for much of the damage to micromechanical devices, previously has not been understood. FIG. 4 is a cross-section side view of the minors shown in FIG. 3 after the mirrors have been damaged by the capillary forces of a recoating material. In FIG. 4, the mirrors 302 are bent toward the substrate.

Several solutions to the problem of damage to the MEMS device caused by the capillary action of the solvent exist. The first solution is to add a surfactant to the coating material to lower the surface tension and capillary forces generated by the coating material. A second option is to select a solvent that provides a low surface tension. If the surface tension of the coating material is low enough, the capillary forces will not be able to deform the mirrors.

Figure 5:
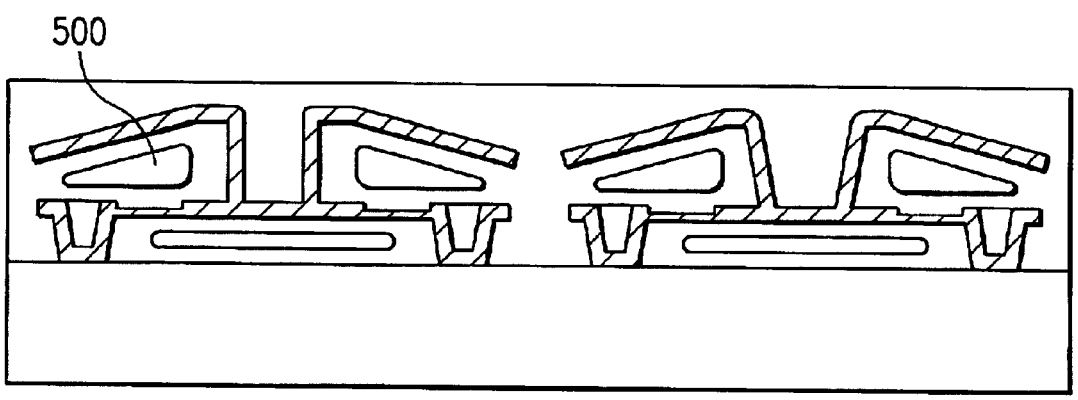
FIG. 5 is a cross-section side view of a micromirror device showing inadequate fill of the recoat resin after evaporation of the solvent.

High quantities of solvent also contribute to mirror damage. Without sufficient resin filler under the mirrors, the capillary forces of the evaporating solvent are able to pull the mirror into the voids left by the evaporating solvent. FIG. 5 is a cross-sectional side view of two micromirror elements showing voids 502 where the solvent has evaporated and the mirror damaged.

In addition to changing the surface tension of the coating material, and controlling the viscosity of the coating material, the viscosity of the coating solution also is changed by changing the molecular weight of the resin. The viscosity can also be changed by changing the quantity of the solvent used to dissolve the resin. Another method of varying the viscosity is to adjust the temperature of the coating material. Even very viscous coating materials can be used with some MEMS devices by nebulizing the coating material and depositing the coating as a droplets instead of as a fluid.

The proper selection and mix of resin and solvent depends on the type of device being coated since the geometry of the device will determine the areas on which the capillary forces operate and the strength of the device. For a typical micromirror device using a coating of AZ-P3D-SF filler resin and PGMEA solvent, a resin content of at least 35% avoids damage to the micromirror superstructure. Higher levels of resin are preferable provided the viscosity of the coating material is controller. Resin contents of 30%, 45.5%, and 50% show excellent results and increasingly prevent damage from the evaporation of the solvent.

The higher the resin filler content of the coating material, the less the capillary forces generated by the solvent damage the device. If there is a high resin loading, the space 304 under the mirrors are essentially reinforced by the resin filler and the evaporating solvent is unable to pull the mirrors into the space 304. Since the resin filler content is related to the viscosity of the coating material, however, the resin filler content cannot be raised arbitrarily without leaving voids under the mirrors cause by insufficient seepage of the resin filler through gaps in the MEMS structure.

Once the proper coating is selected, the coating material is typically deposited on the wafer by expelling the coating material from a syringe and then spinning the wafer. For purposes of illustration and not limitation, the wafer is typically spun at 1500 RPM for 120 seconds. After the coating material is deposited, the material is cured. Various curing methods can be used to evaporate the solvent from the coating material. One method involves the gradual heating of the wafer to evaporate the solvent. The rate of solvent evaporation is controlled by controlling the temperature of the wafer. For example, the solvent could be evaporated gradually until the risk of deformation is passed, and then the rate of evaporation increased. Alternatively, a large excess quantity of solvent is rapidly evaporated and the wafer then cooled to limit the rate of evaporation during a critical phase of the cure when the solvent is most likely to deform the mirrors.

One embodiment of the methods described herein applies an overcoat to a micromirror device. The overcoat is spun onto the micromirror to achieve a uniform coating. The force that is most damaging to the structures during the spin process is capillary attraction. Contrary to popular belief in the field, there is no damage caused to the devices by rapidly moving liquids, even at the interface between the mirrors and the scribe streets. Some of this misapprehension arises from the knowledge that rapidly moving gasses do damage MEMS structures; compressed nitrogen, aimed at the mirrors, will rip them off the substrate. Moving droplets or jets of liquid will similarly destroy the device. In the spinning process the pressures on either side of a mirror are much more even, and little damage occurs. This conclusion could not previously be established, however, because damage due to capillary attraction occurs simultaneously.

While spinning, material is flung off the side of the wafer by centrifugal force, and the solids and solvent are dispersed evenly across the wafer. Solvent begins to evaporate from the solution, and the height of the wet area begins to drop. If the height of the wet area drops near to that of the device structure, capillary forces begin to tug on the device. However, if the resulting coating is thick enough to completely encapsulate the structure, the capillary forces tug nearly equally from all sides of the structure. These opposing forces cancel, and the net force on the device is nearly zero, allowing it to remain unharmed as the solvent evaporates.

By contrast, if the resulting coating is the less than or nearly equal to the height of the device, the capillary forces will tend to pull downwards. These forces will bend the device, reversibly or irreversibly, and can interlock adjacent structures of the device in a landed or collapsed position even if the bending is reversible. As such, as long as there is no undissolved material or bubbles in the solution, and the solution coats the device evenly, a wide variety of choices of solids are acceptable. In one embodiment, the solution is a photoresist, and the solid consists of resin, PAC, surfactants, and adhesion promoters, as is common.

Most solutions that are thick enough to fully coat the device in spinning are too viscous to penetrate the pores of the structure. The strategy of increasing the solids loading of the solution to increase the coating thickness will result in a more viscous liquid, which, if it is able to penetrate the pores of the structure, will do so too slowly to be of value in a manufacturing environment.

In one embodiment, a photoresist with a solids loading of 40% or better is necessary. At less than 40% loading, significant bending of the mirror or hinge occurs. This bending is irreversible for these structures. It may be possible to use thinner resins for devices that bend reversibly, and only need to be protected from directly landing and stiction.

The photoresist is applied with a syringe, pipette, or automatic dispenser. The wafer can be spinning slowly or stationary. After dispense, the solution will slowly flow over the device, and a wait period is prescribed that is specific to the resist used. The procedure tends to trap bubbles under the devices and the bubbles must be dissipated before the spin process starts.

Generally, resists with viscosities less than 120 centistokes were able to penetrate the pores of a micromirror array in two minutes or less. Two minutes is deemed as the maximum acceptable delay for a standard semiconductor manufacturing environment.

Three other factors that can influence the rate at which the solution even covers the structure are its surface tension, the wetting of the structures, and the ability of the solution to dissolve gasses. Some resists, for instance, flowed down in between the mirrors, while others wicked underneath them.

Gasses are often trapped underneath the micromirrors. Any bubbles left in the device can cause damage during the spin process, or lead to cracking as the gasses expand and escape from the spun wafer during the bake process. Great care should be taken to assure that no bubbles or other particles are present before spinning. Some recoat solutions are relatively more efficient at dissipating these trapped gasses than others.

There are no commercial resists that have the requisite solids loading and still can penetrate the device pores in a short enough period for the process to be acceptable in a manufacturing environment. A custom resist with a solids loading of 49% and a viscosity of 118 centistokes is an ideal coating solution. This resist met the need for a high manufacturing environment throughput, coating thickness, and coating uniformity.

The spinning process is tolerant of adjustment as long as the above coating parameters are met. The spin speed and ramp rate affect coating thickness and uniformity. A spin speed of 3000 rpm was used, followed by a 100° C. hotplate bake to harden the resist and allow the wafer to survive further processing.

After processing and mounting into a package, the devices can be ashed cleanly. The recoat method does not have any effect of the process on such parameters as the hinge period, mirror planarity, or any device dynamics after packaging.

This process described above in relation to micromirror fabrication is intended as an example and in no way limits the utility of the invention for other applications. Prior to application of the coating solution, a device may be immersed in another solution as part of an etch procedure or other chemical modification to the superstructure.

An alternative recoat method uses a combination of a thin solvent layer and a thicker resist layer to coat the free-standing micromechanical structures. A thin layer of pure solvent such as (PGMEA) or a thin resist is applied to the wafer. This thin layer generally is applied thick enough to cover the structures on the wafer. Excess amounts of the thin layer may be removed by briefly spinning the wafer. Spinning the wafer may help to evenly distribute the solvent layer.

A thicker coat of resist is then applied to the wafer. Depending on the structures being coated, a standard resist may be used, or a thicker resist comprising at least 35% dissolved solids, as described above. The thicker layer of resist displaces the thin solvent layer almost instantaneously. The wafer may be spun to remove the excess solvent and resist after the thicker layer of resist has displaced the solvent layer. The thicker resist layer remaining on the wafer maybe cured as described above.

Alternatively, the wafer may be spun slowly during the application of the thicker resist layer. When the wafer slowly is spun, the thinner solution is displaced by the thicker one, and the thick resist layer flows to the edge of the wafer due to centrifugal force. This flow process occurs with minimal mixing of the two solutions. Proper control of the spinning parameters (appropriate to the coating solution) provides a high-quality, uniform coating similar to that discussed above. The thicker resist layer remaining on the wafer may be cured as described above.

Although intended as a method of enabling wafer level testing of the micromechanical structures prior to device separation, the same methods may be used to apply an overcoat to a micromachined part mounted in a package substrate.

Thus, although there has been disclosed to this point a particular embodiment for a method and system of re-coating MEMS devices using dissolved resins, it is not intended that such specific references be considered as limitations upon the scope of this invention. Furthermore, having described the invention in connection with certain specific embodiments thereof, it is to be understood that further modifications may now suggest themselves to those skilled in the art, it is intended to cover all such modifications.

What is claimed is:

1. A method of coating free-standing micromechanical devices, the method comprising:
depositing an organic resin coating material on said micromechanical device in sufficient quantity to substantially encapsulate micromechanical device, said coating material comprised of at least 35% solids in a solvent, said coating material having a viscosity no greater than 120 centistokes; and curing said coating material.

2. The method of claim 1, said depositing comprising depositing a coating material having a viscosity of 118 centistokes.

3. The method of claim 1, said depositing comprising depositing a coating material having a surfactant.

4. The method of claim 1, said depositing comprising depositing said coating material in a layer thick enough to cover structures on said micromechanical device after the removal of said solvent.

5. The method of claim 1, comprising:
rotating said micromechanical device to distribute said organic coating material.

6. The method of claim 1, comprising:
rotating said micromechanical device at 3000 rpm to distribute said organic coating material.

7. The method of claim 1, said curing comprising:
heating said micromechanical device.

8. The method of claim 1, said curing comprising:
heating said micromechanical device at 100° C.

9. The method of claim 1, said curing comprising:
heating said micromechanical device to a first elevated temperature to remove a majority of said solvent, and then lowering said temperature to remove additional solvent.

10. A method of coating free-standing micromechanical devices, the method comprising:

depositing an organic resin coating material on said micromechanical device in sufficient quantity to substantially encapsulate said micromechanical device, said coating material comprised of at least 35% solids in a solvent said coating material having a viscosity no greater than 120 centistokes;

rotating said micromechanical device to distribute said organic coating material; and curing said coating material.

11. The method of claim 10, said depositing comprising depositing a coating material having a viscosity of 118 centistokes.

12. The method of claim 10, said depositing comprising depositing a coating material having a surfactant.

13. The method of claim 10, said depositing comprising depositing said coating material in a layer thick enough to cover structures on said micromechanical device after the removal of said solvent.

14. The method of claim 10, comprising:

rotating said micromechanical device at 3000 rpm to distribute said organic coating material.

15. The method of claim 10, said curing comprising:

heating said micromechanical device.

16. The method of claim 10, said curing comprising:

heating said micromechanical device at 100° C.

17. The method of claim 10, said curing comprising:

heating said micromechanical device to a first elevated temperature to remove a majority of said solvent, and then lowering said temperature to remove additional solvent.

18. A method of coating free-standing micromechanical devices, the method comprising:

depositing an organic resin coating material on said micromechanical device in sufficient quantity to substantially encapsulate said micromechanical device, said coating material comprised of at least 40% solids in a solvent, said coating material having a viscosity no greater than 120 centistokes; and curing said coating material.

19. The method of claim 18, said depositing comprising depositing a coating material comprised of between 40 and 50% solids.

20. The method of claim 18, said depositing comprising depositing a coating material comprised of 49% solids.

21. The method of claim 18, said depositing comprising depositing a coating material having a viscosity of 118 centistokes.

22. The method of claim 18, said depositing comprising depositing a coating material having a surfactant.

23. The method of claim 18, said depositing comprising depositing said coating material in a layer thick enough to cover structures on said micromechanical device after the removal of said solvent.

24. The method of claim 18, comprising:

rotating said micromechanical device to distribute said organic coating material.

25. The method of claim 18, comprising:

rotating said micromechanical device at 3000 rpm to distribute said organic coating material.

26. The method of claim 18, said curing comprising:

heating said micromechanical device.

27. The method of claim 18, said curing comprising:

heating said micromechanical device at 100° C.

28. The method of claim 18, said curing comprising:

heating said micromechanical device to a first elevated temperature to remove a majority of said solvent, and then lowering said temperature to remove additional solvent.

29. A method of coating free-standing micromechanical devices, the method comprising:

depositing a solvent layer on said micromechanical device having moveable structures wider than such structures are high;

depositing an organic resin coating material on said solvent layer in sufficient quantity to substantially encapsulate said moveable structures;

allowing said organic resin coating material to displace said solvent layer; and curing said organic resin coating material.

30. The method of claim 29, said depositing an organic resin coating material comprising depositing an organic resin coating material having a viscosity no greater than 120 centistokes.

31. The method of claim 29, said depositing an organic resin coating material comprising depositing an organic resin coating material having a viscosity of 118 centistokes.

32. The method of claim 29, said depositing a solvent layer comprising depositing a layer of propylene glycol monomethyl ether.

33. The method of claim 29, said depositing an organic resin coating material comprising depositing an organic resin coating material comprised of at least 35% solids in a solvent.

34. The method of claim 29, said depositing a solvent layer comprising depositing a layer of solvent and dissolved organic resin.

35. The method of claim 29, said depositing a solvent layer comprising depositing a layer of propylene glycol monomethyl ether and dissolved organic resin.

36. The method of claim 29, comprising:

rotating said micromechanical device to distribute said solvent.

37. The method of claim 29, comprising:

rotating said micromechanical device to distribute said organic resin coating material.

38. The method of claim 29, comprising:

rotating said micromechanical device to remove excess solvent.

39. The method of claim 29, comprising:

rotating said micromechanical device to remove excess organic resin coating material.

40. The method of claim 29, said curing comprising:

heating said micromechanical device.

41. The method of claim 29, said curing comprising:

heating said micromechanical device at 100° C.

42. The method of claim 29, said curing comprising:

heating said micromechanical device to a first elevated temperature to remove a majority of said solvent, and then lowering said temperature to remove additional solvent.

* * * * *